US009281841B2

(12) United States Patent
Chen et al.

(10) Patent No.: US 9,281,841 B2
(45) Date of Patent: Mar. 8, 2016

(54) LOAD BALANCED DECODING OF LOW-DENSITY PARITY-CHECK CODES

(71) Applicant: LSI Corporation

(72) Inventors: Lei Chen, Sunnyvale, CA (US); Fan Zhang, Milpitas, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 217 days.

(21) Appl. No.: 13/664,490

(22) Filed: Oct. 31, 2012

(65) Prior Publication Data

US 2014/0122959 A1 May 1, 2014

(51) Int. Cl.
*H03M 13/00* (2006.01)
*H03M 13/11* (2006.01)

(52) U.S. Cl.
CPC ........ *H03M 13/1111* (2013.01); *H03M 13/116* (2013.01)

(58) Field of Classification Search
CPC . H04L 1/0057; H04L 1/0041; H03M 13/116; H03M 13/1111; H03M 13/1137
See application file for complete search history.

(56) References Cited

U.S. PATENT DOCUMENTS

| | | | |
|---|---|---|---|
| 7,770,090 B1 * | 8/2010 | Kons et al. | 714/780 |
| 8,151,161 B2 | 4/2012 | Cho et al. | |
| 8,473,806 B1 * | 6/2013 | Rad et al. | 714/752 |
| 8,745,471 B2 * | 6/2014 | Murakami et al. | 714/781 |
| 8,745,473 B2 * | 6/2014 | Murakami et al. | 714/790 |
| 2006/0161830 A1 * | 7/2006 | Yedidia et al. | 714/758 |
| 2008/0052594 A1 * | 2/2008 | Yedidia et al. | 714/758 |
| 2008/0104474 A1 * | 5/2008 | Gao et al. | 714/752 |
| 2009/0063926 A1 * | 3/2009 | Cho et al. | 714/752 |
| 2009/0164540 A1 * | 6/2009 | Oh et al. | 708/207 |
| 2009/0213953 A1 * | 8/2009 | Yang | 375/261 |
| 2009/0265600 A1 * | 10/2009 | Matsumoto et al. | 714/752 |
| 2010/0192044 A1 * | 7/2010 | Bai et al. | 714/763 |
| 2011/0087946 A1 * | 4/2011 | Planjery et al. | 714/752 |
| 2011/0099448 A1 * | 4/2011 | Mohsenin et al. | 714/752 |
| 2011/0126078 A1 * | 5/2011 | Ueng et al. | 714/755 |
| 2011/0179333 A1 * | 7/2011 | Wesel et al. | 714/752 |
| 2011/0252286 A1 * | 10/2011 | Li et al. | 714/755 |
| 2011/0283158 A1 * | 11/2011 | Yang et al. | 714/752 |
| 2012/0221914 A1 * | 8/2012 | Morero et al. | 714/752 |
| 2014/0068381 A1 * | 3/2014 | Zhang | 714/770 |

* cited by examiner

*Primary Examiner* — Albert Decady
*Assistant Examiner* — Enamul M Kabir

(57) ABSTRACT

A method for determining update candidates in a low-density parity-check decoding process includes dividing the quasi-cyclic columns into groups and identifying an update candidate in each group. One or more of the identified update candidates are then updated. In the first half of iterative process, the higher quality candidate is updated. In the second half of the iterative process, the lower quality candidate is updated.

20 Claims, 2 Drawing Sheets

LOAD BALANCED DECODING OF LOW-DENSITY PARITY-CHECK CODES

BACKGROUND OF THE INVENTION

In an irregular decoder of a regular code, variables with better quality metrics have a greater chance of receiving message updates in early decoding stages. In later stages, variables with worse quality metrics have a greater chance of receiving updates.

During low-density parity-check decoding iterations, columns are sorted to determine which columns to update. Sorting of a long vector involves long latency and extra sorting logic in circuit.

Consequently, it would be advantageous if an apparatus existed that is suitable for selecting update candidates in a low-density parity-check decoding process without sorting all of the message columns.

SUMMARY OF THE INVENTION

Accordingly, the present invention is directed to a novel method and apparatus for selecting update candidates in a low-density parity-check decoding process without sorting all of the message columns.

At least embodiment of the present invention is a method for selecting a low-density parity-check update candidate. A decoder divides all of the message columns into two or more groups. Each message column has a quality metric; within each group, the quality metrics are compared to determine one update candidate from each group. One or more of the update candidates is then updated.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

In irregular decoding of a regular low-density parity-check code, better quality variable nodes (variable nodes having metrics such as log-likelihood-ratios indicating a relatively better ability to produce a hard decision) have a better chance of receiving message updates in the early decoding stages. In later stages, worse variable nodes have a better chance of receiving updates. Irregular decoding of regular low-density parity-check codes provides better signal-to-noise ratio gain as compared to regular decoding.

Figure 1:
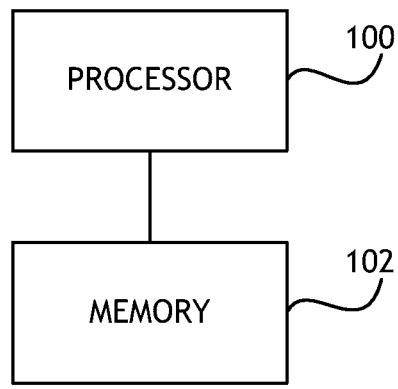
FIG. 1 shows a block diagram of a system useful for implementing embodiments of the present invention.

Referring to FIG. 1, a block diagram of a system useful for implementing embodiments of the present invention is shown. The computing device includes a processor 100 connected to a memory 102. The processor 100 is configured to execute computer executable program code to implement methods according to embodiments of the present invention. The memory 102 is configured to store computer executable program code to implement methods according to embodiments of the present invention and to store output of embodiments of the present invention in appropriate data structures. In at least one embodiment of the present invention, the processor 100 and memory 102 are part of a communication system configured to decode low-density parity-check encoded messages.

Figure 2:
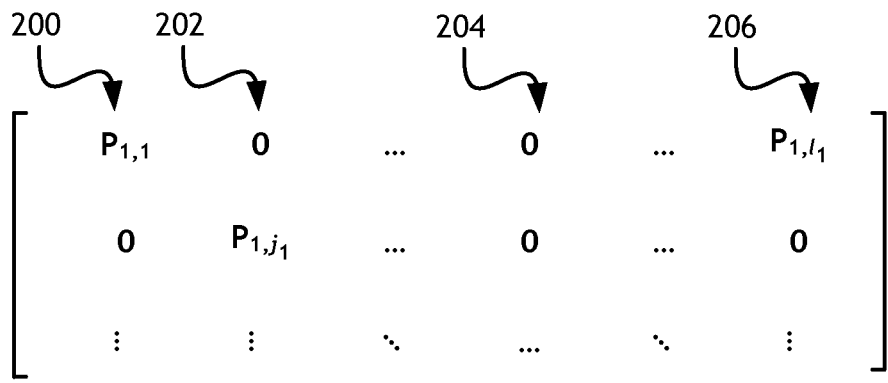
FIG. 2 shows a parity check matrix for a low-density parity-check decoder.

Referring to FIG. 2, a parity check matrix for a low-density parity-check decoder is shown. In some embodiments of the present invention, a parity check matrix is a K by L matrix having zero elements 202, 204 and non-zero elements defined by a circulant matrix 200, 206.

Figure 3:
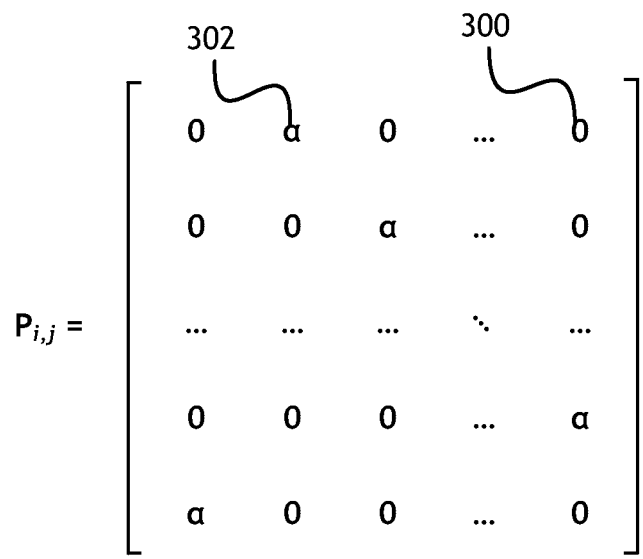
FIG. 3 shows a quasi-cyclic circulant matrix representing an element in a parity check matrix.
Figure 4:
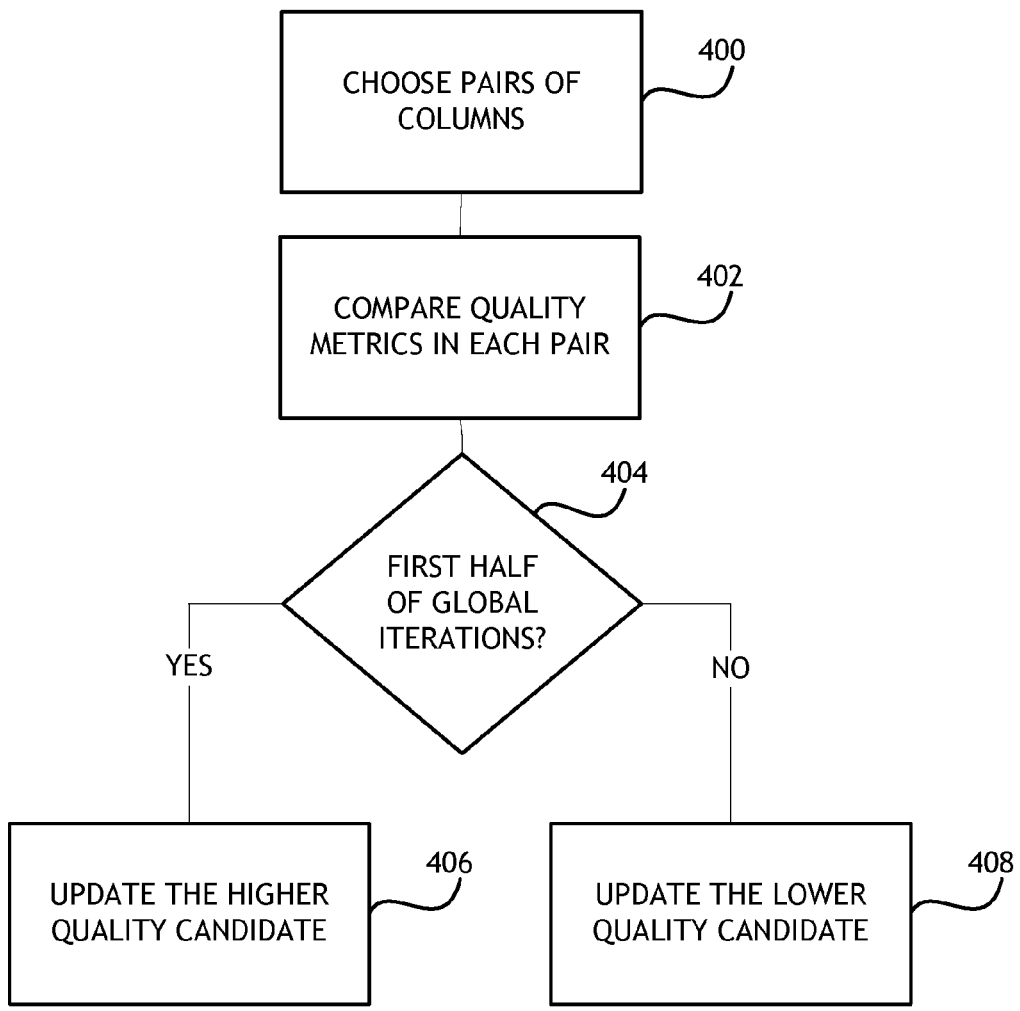
FIG. 4 shows a flowchart of a method for selecting circulants to receive updates.

Referring to FIG. 3, a quasi-cyclic circulant matrix representing an element in a parity check matrix; is shown. A parity check matrix useful in at least one embodiment of the present invention comprises a finite Galois Field. The parity check matrix comprises twelve circulant rows and one hundred eight circulant columns; each circulant in the parity check matrix comprises a sub-matrix.

Each sub-matrix comprises a forty-eight by forty-eight matrix. A circulant sub-matrix according to at least one embodiment of the present invention includes columns having zero elements 300 and non-zero elements 302 that are defined as an element over a Galois Field.

In at least one embodiment of the present invention, a low-density parity-check code is decoded. The low-density parity-check code comprises a parity check matrix having elements that are quasi-cyclic circulants. Each quasi-cyclic-circulant is a ninety-six by ninety-six matrix. The parity-check matrix comprises three rows and two hundred eighty-eight columns of quasi-cyclic-circulant matrices.

Variables within a quasi-cyclic matrix are processed in parallel. An irregular decoder requires sorting of the quality metrics of the two hundred eighty-eight quasi-cyclic columns before message updates. The decoder decides which quasi-cyclic columns will be updated. Sorting quality metrics of the two hundred eighty-eight quasi-cyclic columns takes a substantial amount of time and requires extra circuit logic. Where columns are updated randomly, the quality metric of the column with the highest quality metric out of n columns is approximately $$\theta\left(\frac{\log n}{\log \log n}\right).$$

At least one embodiment of the present invention is a load-balancing decoding method to decode a low-density parity-check encoded message without sorting on the quality metrics.

Load balancing is a methodology in computer science to distribute workload across multiple processors, computers or a computer cluster, network links, central processing units, disk drives, or other resources, to achieve optimal resource utilization, maximize throughput, minimize response time, and avoid overload.

In at least one embodiment of the present invention, in each iteration, one hundred forty-four pairs of quasi-cyclic columns are chosen 400 in parallel by an affine permutation randomized over time, for example by the global iteration index and local iteration index. The groupings of quasi-cyclic columns are effectively chosen at random. Within each pair, the quality metrics of the two quasi-cyclic columns are compared 402 without regard to any other pair of quasi-cyclic columns.

Low-density parity-check decoding often requires numerous iterations of updates to unsatisfied constraints. In at least one embodiment of the present invention, the decoder determine 404 if decoding is currently in the first half of global iterations. During the first half of global iterations, the higher quality quasi-cyclic column if each pair is updated 406, while the lower quality quasi-cyclic column receives no update. During the second half of global iterations, the lower quality quasi-cyclic column if each pair is updated 408.

By this method, the maximum quality metric is $$\theta\left(\frac{\log \log 288}{\log 2}\right),$$

or more generally $$\theta\left(\frac{\log \log n}{\log 2}\right)$$

for n quasi-cyclic columns. Furthermore, while the forgoing discussion specifically concerned pairs of quasi-cyclic columns, the same principle applied to other groupings of columns would yield a maximum quality metric of $$\theta\left(\frac{\log \log n}{\log d}\right)$$

where d is the number of columns in each grouping.

It is believed that the present invention and many of its attendant advantages will be understood by the foregoing description of embodiments of the present invention, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for selecting a low-density parity-check update candidate, comprising:
   dividing a plurality of low-density parity-check message columns into groups of two;
   comparing at least one quality metric of each low-density parity-check message column within each group;
   determining if a decoding process is in a first half of global iterations or a second half of global iterations; and
   updating one low-density parity-check message column in each group depending on the determination that the decoding process is in the first half of global iterations or the second half of global iterations.

2. The method of claim 1, further comprising producing one update candidate from each group based on the quality metric comparison.

3. The method of claim 2, wherein the update candidate from each group comprises the column having the highest at least one quality metric.

4. The method of claim 2, wherein the update candidate from each group comprises the column having the lowest at least one quality metric.

5. The method of claim 1, wherein elements within low-density parity-check message comprise quasi-cyclic circulant matrices.

6. The method of claim 1, wherein each of the two or more groups comprises two low-density parity-check message columns.

7. The method of claim 1, wherein the low-density parity-check message columns are divided into groups randomly.

8. An apparatus for selecting a low-density parity-check update candidate, comprising:
   a processor;
   memory connected to the processor; and
   computer executable program code configured to:
      divide a plurality of low-density parity-check message columns into groups of two;
      compare at least one quality metric of each low-density parity-check message column within each group;
      determine if a decoding process is in a first half of global iterations or a second half of global iterations; and
      update one low-density parity-check message column in each group depending on the determination that the decoding process is in the first half of global iterations or the second half of global iterations.

9. The apparatus of claim 8, the computer executable program code is further configured to produce one update candidate from each group based on the quality metric comparison.

10. The apparatus of claim 9, wherein the update candidate from each group comprises the column having the highest at least one quality metric.

11. The apparatus of claim 9, wherein the update candidate from each group comprises the column having the lowest at least one quality metric.

12. The apparatus of claim 8, wherein elements within low-density parity-check message comprise quasi-cyclic circulant matrices.

13. The apparatus of claim 8, wherein each of the two or more groups comprises two low-density parity-check message columns.

14. The apparatus of claim 8, wherein the low-density parity-check message columns are divided into groups randomly.

15. A communication system, comprising:
   a processor configured for selecting a low-density parity-check update candidate;
   memory connected to the processor; and
   computer executable program code configured to:
      divide a plurality of low-density parity-check message columns into groups of two;
      compare at least one quality metric of each low-density parity-check message column within each group;
      determine if a decoding process is in a first half of global iterations or a second half of global iterations; and
      update one low-density parity-check message column in each group depending on the determination that the decoding process is in the first half of global iterations or the second half of global iterations.

16. The system of claim 15, wherein the computer executable program code is further configured to produce one update candidate from each group based on the quality metric comparison.

17. The system of claim 16, wherein the update candidate from each group comprises the column having the highest at least one quality metric.

18. The system of claim 16, wherein the update candidate from each group comprises the column having the lowest at least one quality metric.

19. The system of claim 15, wherein elements within low-density parity-check message comprise quasi-cyclic circulant matrices.

20. The system of claim 15, wherein each of the two or more groups comprises two low-density parity-check message columns.

* * * * *